(12) United States Patent
Wu et al.

(10) Patent No.: US 7,911,840 B2
(45) Date of Patent: Mar. 22, 2011

(54) LOGGED-BASED FLASH MEMORY SYSTEM AND LOGGED-BASED METHOD FOR RECOVERING A FLASH MEMORY SYSTEM

(75) Inventors: Hsin-Hsien Wu, Hsinchu (TW); Yu-Mao Kao, Hsinchu (TW); Yung-Li Ji, Hsinchu (TW); Chih-Nan Yen, Hsinchu (TW); Fu-Ja Shone, Hsinchu (TW)

(73) Assignee: Skymedi Corporation, Hsinchu (TW)

( * ) Notice: Subject to any disclaimer, the term of this patent is extended or adjusted under 35 U.S.C. 154(b) by 160 days.

(21) Appl. No.: 12/318,872

(22) Filed: Jan. 12, 2009

(65) Prior Publication Data

US 2010/0061150 A1    Mar. 11, 2010

(30) Foreign Application Priority Data

Sep. 10, 2008   (TW) .............................. 97134745 A

(51) Int. Cl.
*G11C 14/00*    (2006.01)
(52) U.S. Cl. ............... 365/185.08; 365/185.18; 365/226
(58) Field of Classification Search ............. 365/185.08, 365/185.18, 226
See application file for complete search history.

(56) References Cited

U.S. PATENT DOCUMENTS

| | | | |
|---|---|---|---|
| 6,418,506 B1 * | 7/2002 | Pashley et al. ................. | 711/103 |
| 6,438,668 B1 * | 8/2002 | Esfahani et al. ............... | 711/165 |
| 7,017,078 B2 * | 3/2006 | Frimout .......................... | 714/20 |
| 7,080,222 B1 * | 7/2006 | Srinivasagam et al. ........ | 711/162 |
| 7,228,469 B2 * | 6/2007 | Ito .................................. | 714/718 |

* cited by examiner

*Primary Examiner* — Connie C Yoha
(74) *Attorney, Agent, or Firm* — Rosenberg, Klein & Lee

(57) ABSTRACT

A flash memory system includes a path selector to determine to write to a non-volatile memory, a volatile memory or both the non-volatile memory and the volatile memory when the flash memory system is to write data. A record is stored in the non-volatile memory which is updated the status of the non-volatile memory after each one or more writing operations. When the flash memory system is powered on after a power loss, it could be recovered to a command executed prior to the power loss or to any checkpoint prior to the power loss by using the record.

9 Claims, 7 Drawing Sheets

LOGGED-BASED FLASH MEMORY SYSTEM AND LOGGED-BASED METHOD FOR RECOVERING A FLASH MEMORY SYSTEM

FIELD OF THE INVENTION

The present invention is related generally to a flash memory system and, more particularly, to a logged-based flash memory system and a logged-based method for recovering a flash memory system.

BACKGROUND OF THE INVENTION

The flash memory systems store data in non-volatile memories, which are accessed by blocks. In further detail, the unit to erase a non-volatile memory is a block, and data is written sequentially to a non-volatile memory in the unit of page. Therefore, it is disadvantageous to random read/write operations with non-volatile memories. Moreover, to write data having a size smaller than the minimum writing unit of a non-volatile memory or not sequentially to a non-volatile memory, it is required to search for a free block in the non-volatile memory in advance. To do so, a block in the non-volatile memory may have to be erased for the writing operation. Unfortunately, the lifetime of a non-volatile memory decreases as the number of erasing operations increases.

Therefore, it is desired a flash memory system for reduction of erasing operations to extend its lifetime.

SUMMARY OF THE INVENTION

An object of the present invention is to provide a flash memory system having a longer lifetime.

Another object of the present invention is to provide a method for recovering a flash memory system after a power loss.

According to the present invention, a flash memory system includes a path selector to determine to write to a non-volatile memory, a volatile memory or both the non-volatile memory and the volatile memory when the flash memory system is to write data. The volatile memory is used to store smaller amount of data or data written out of sequence. Once the volatile memory accumulates more data or becomes full of data, the data therein is written to the non-volatile memory. As a result, the lifetime of the non-volatile memory will be extended because the number of erasing operations with the non-volatile memory is reduced, and therefore the flash memory system may have a longer lifetime.

According to the present invention, a method for recovering a flash memory system includes storing a record in a non-volatile memory of the flash memory system to update the status of the non-volatile memory after each one or more writing operations, and scanning blocks of the non-volatile memory when the flash memory system is powered on after a power loss to recover a known good record from the non-volatile memory. The last written block will be detected to determine if it is the last known good block in the good record. If the last written block is the last known good block, it will be joint to a mapping of logical block addresses and physical block addresses, otherwise, it will be erased and a last known good block will be found out from the good record to join to the mapping.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAIL DESCRIPTION OF THE INVENTION

Figure 1:
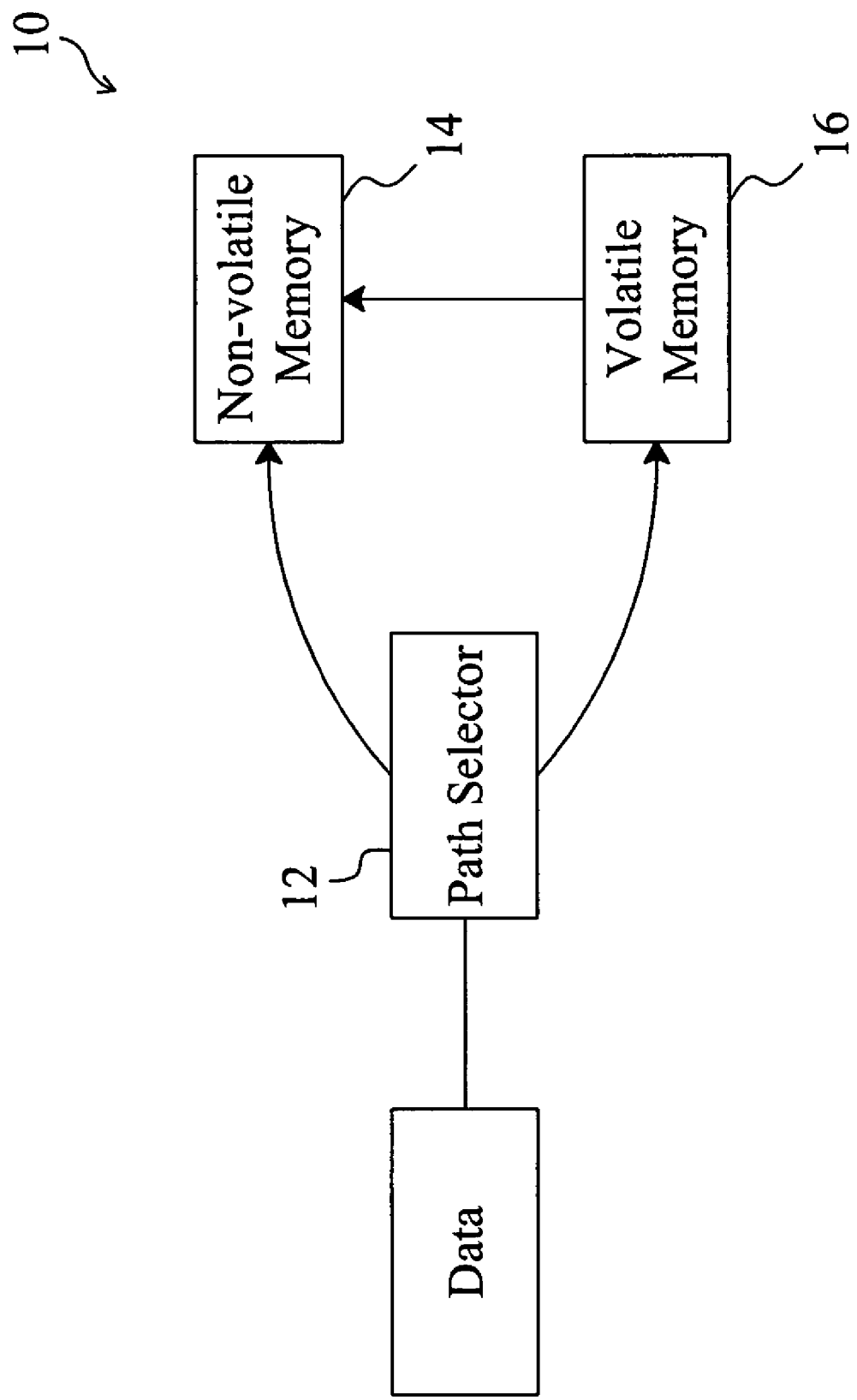
FIG. 1 is a block diagram of a flash memory system according to the present invention.

As shown in FIG. 1, a flash memory system 10 according to the present invention includes a path selector 12 coupled to a non-volatile memory 14 and a volatile memory 16. When the flash memory system 10 is to read data, the data may be read from either one or both of the non-volatile memory 14 and the volatile memory 16. Likewise, to write data, the path selector 12 will determine to write the data to either one or both of the non-volatile memory 14 and the volatile memory 16. If the data is to be sequentially written and has a size sufficient to fill in an entire page, the path selector 12 will select to write the data to the non-volatile memory 14. If the data to be written is out of sequence or has a size insufficient to fill in an entire page, the path selector 12 will select to write the data to the volatile memory 16. The volatile memory 16 plays a role of storing random accessed data, and once it accumulates more data or is full of data, the data stored in the volatile memory 16 will be written to the non-volatile memory 14. In this way, the non-volatile memory 14 will experience less erasing operations and have a longer lifetime consequently. The data in the volatile memory 16 may be written to the non-volatile memory 14 at any time, such as when the volatile memory 16 is full, is half-full, contains data or contains no data. Moreover, the amount of data written back to the non-volatile memory 14 may be equal to or less than the capacity of the volatile memory 16. If the flash memory system 10 is used in a Redundant Array of Independent Disks (RAID) system, two or more homogenous or heterogeneous sub-systems in the RAID system may write data back to the non-volatile memories at a same time with a single command.

Figure 2:
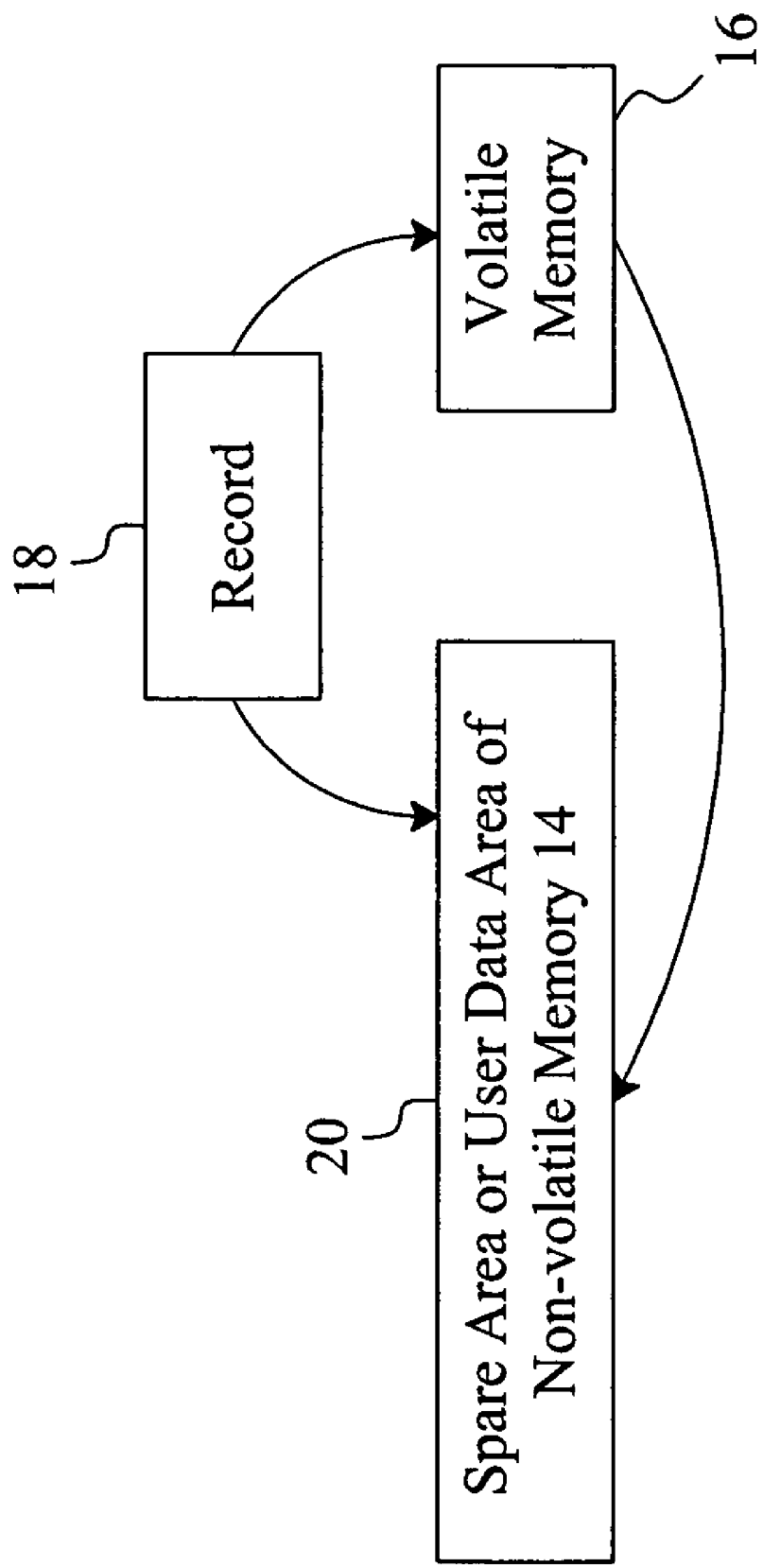
FIG. 2 is a diagram to show the operation of a record according to the present invention.

The volatile memory 16 requires electric power in order to maintain the data stored therein. In case the flash memory system 10 suffers a power loss, the data stored in the volatile memory 16 may be lost and causes inconsistence to the non-volatile memory 14. Hence, a method is proposed for recovering the flash memory system 10 to a status prior to a power loss for data consistency. The method for recovering the flash memory system 10 is logged-based and includes maintaining a record stored in the non-volatile memory 14. The record records the status of the non-volatile memory 14 and is updated after each one or more writing operations, with a counter, a bit, an array, a particular flag or any data structure capable of being recorded. As shown in FIG. 2, the record 18 made each time after one or more writing operations may be stored in the volatile memory 16 or the non-volatile memory 14. If the record 18 is stored in the volatile memory 16, it will be written back to the non-volatile memory 14 within a fixed period, for example in a spare area or a user data area 20 of the non-volatile memory 14.

Figure 3:
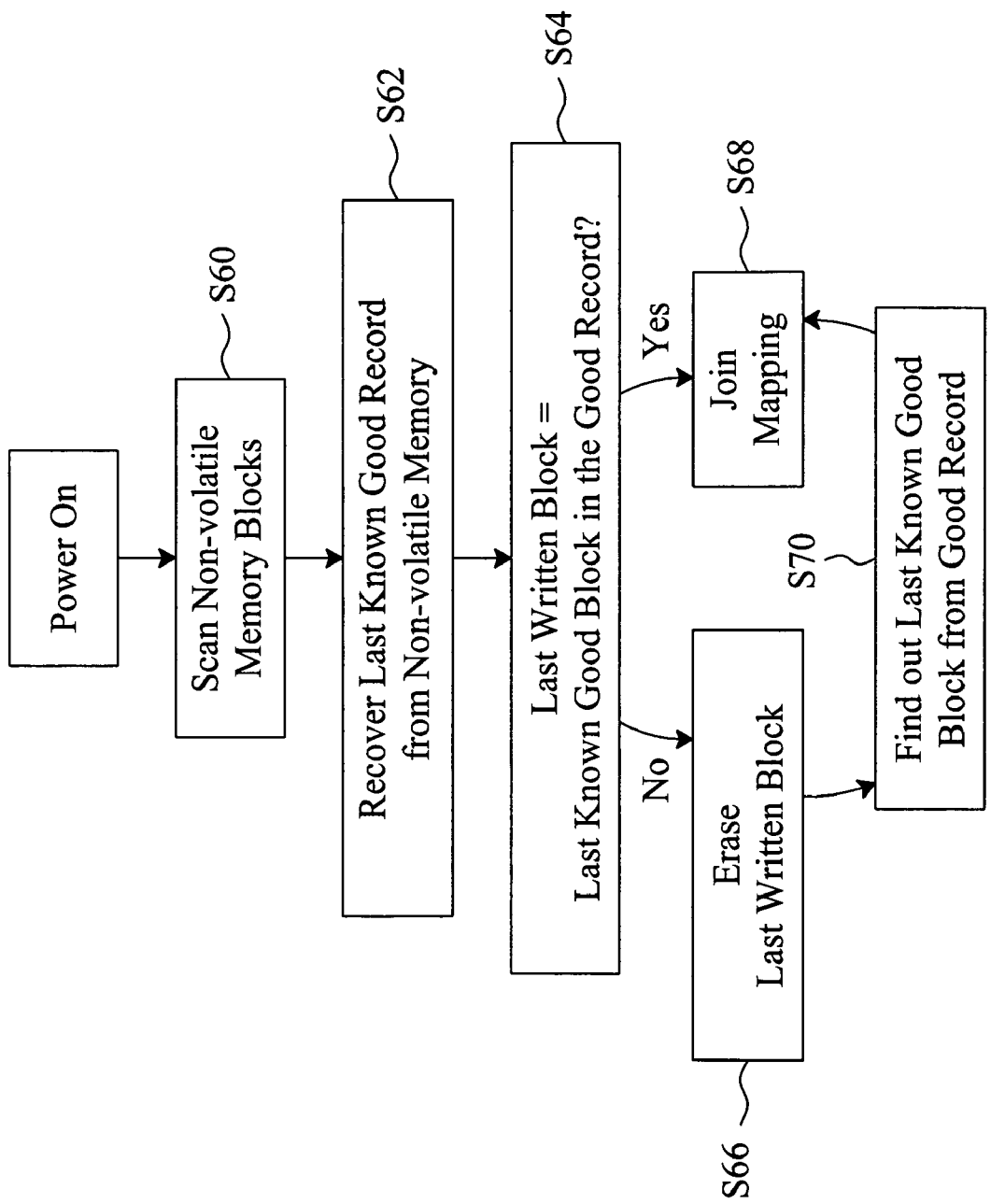
FIG. 3 is a flowchart for a flash memory system powered on after a power loss according to the present invention.

As shown in FIG. 3, when the flash memory system 10 is powered on after a power loss, it will scan blocks of the non-volatile memory 14 in step S60 and then, in step S62, the last known good record will be recovered from the non-volatile memory 14. According to the good record, step S64 determines whether or not the last written block is the last known good block in the good record. If yes, in step S68, the last written block will join to a mapping of logical block addresses (LBAs) versus physical block addresses (PBAs); otherwise, the last written block will be erased in advance in step S66, and in step S70, the last known good block will be found out from the good record and join to the mapping of LBAs versus PBAs. In this process, the good record is not necessarily the last known record.

Figure 4:
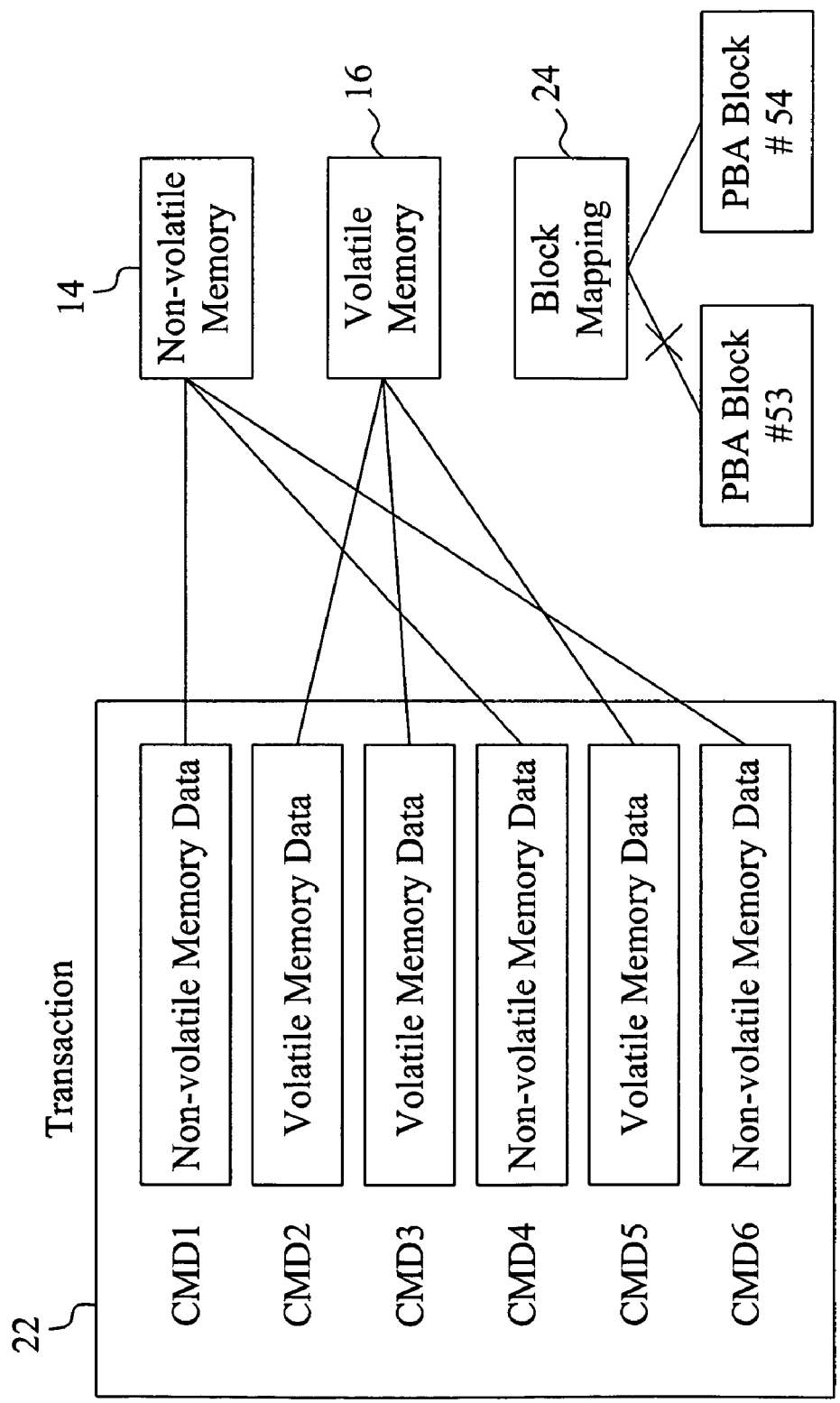
FIG. 4 is a diagram to show an embodiment of writing data in a flash memory system according to the present invention.
Figure 5:
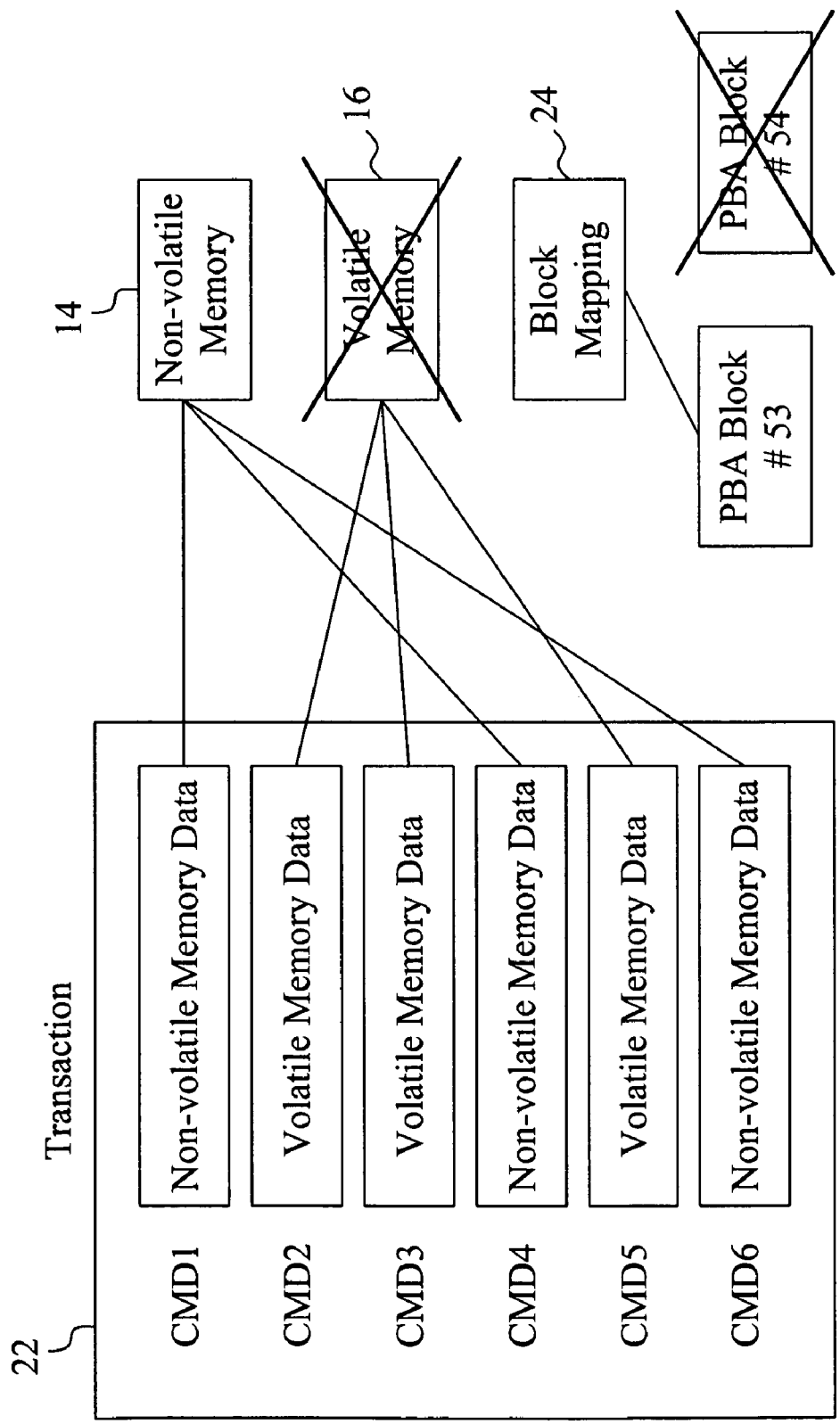
FIG. 5 is a diagram to show an embodiment of recovering the flash memory system shown in FIG. 4 after a power loss.

FIG. 4 illustrates a transaction including data writing in the flash memory system 10, and FIG. 5 illustrates how the flash memory system 10 is recovered after a power loss. In the flash memory system 10, each transaction is an indivisible data writing, and any division thereof will cause a data error. Any command before a checkpoint to write data from the volatile memory 16 to the non-volatile memory 14 is considered a transaction. A checkpoint is a time point when data is written from the volatile memory 16 to the non-volatile memory 14. In FIG. 4, a transaction 22 includes six commands CMD1-CMD6, in which the commands CMD1, CMD4 and CMD6 function to write data to the non-volatile memory 14, and the commands CMD2, CMD3 and CMD5 function to write data to the volatile memory 16. During the execution of the transaction 22, the flash memory system 10 changes a block corresponding to a block mapping 24 of LBAs versus PBAs from a PBA block no. 53 to a PBA block no. 54. Assuming that an accidental power loss occurs during the execution of the command CMD4, the data in the volatile memory 16 will be lost after the flash memory system 10 is powered on again, as shown in FIG. 5. Consequently, the data that has been written by the transaction 22 becomes totally unusable, and the block mapping 24 of the non-volatile memory 14 has been altered. Hence, the block mapping 24 has to be changed from the PBA block no. 54 back to the PBA block no. 53 according to the record stored in the non-volatile memory 14 in order to maintain data consistency.

Figure 6:
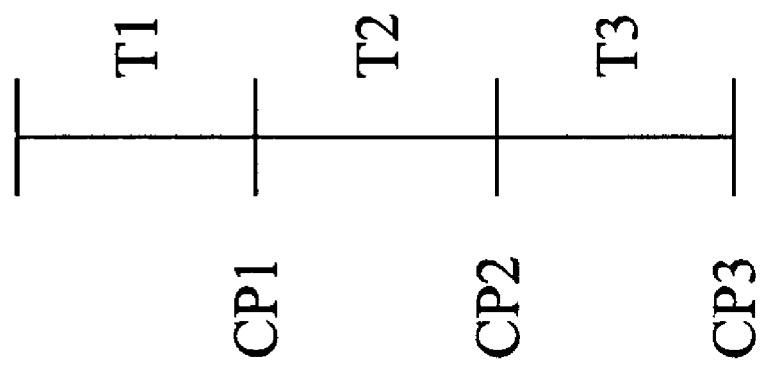
FIG. 6 is a diagram to show some checkpoints to write data from a volatile memory to a non-volatile memory according to the present invention.

As shown in FIG. 6, the volatile memory 16 records the current status of the non-volatile memory 14 and writes the records along with the data back to the non-volatile memory 16 each time a transaction T1, T2 or T3 is completed. In case a power loss occurs during the execution of the transaction T3, the flash memory system 10 can recover the data in the non-volatile memory 14 back to the status at the checkpoint CP2 or to the status at an earlier time point, e.g., the status at the checkpoint CP1.

Figure 7:
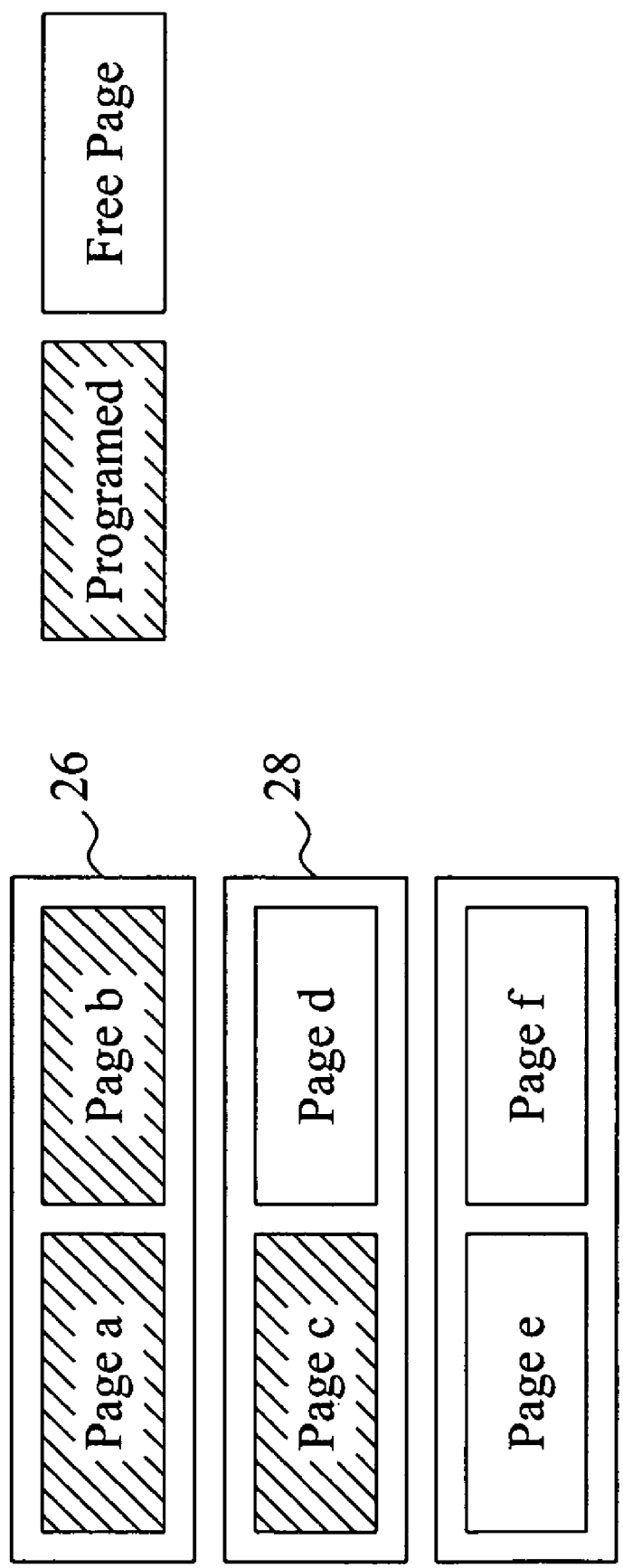
FIG. 7 is a block diagram of a non-volatile memory having paired pages.

Some non-volatile memories maybe have paired pages. If an abnormal interruption occurs during a writing operation, not only the page currently being written will be damaged, but also its paired page may also suffer from damages, causing incorrect data in these pages. Hence, when a such non-volatile memory makes records, the paired page subjected to a possible damaged page is backed up to ensure a successful recovery to the last good status. As shown in FIG. 7, in paired pages 26 and 28, pages a, b and c have already been written with data. In this case, if a power loss occurs suddenly when data is being written to a page d of the paired pages 28, the pages a and b will not be affected but data in the page c may be damaged. Therefore, the status of the page c is also recorded. If the non-volatile memory 14 has the paired-pages issue, additionally pages may also be written from the volatile memory 16 to the non-volatile memory 14 when writing data for a page from the volatile memory 16 to the non-volatile memory 14. The pages written back to the non-volatile memory 14 are not limited to the ones affected by the paired pages, but may be a range of pages in which only some are affected by the paired pages.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A method for recovering a flash memory system including a non-volatile memory, comprising the steps of:
   recording a status of the non-volatile memory in the non-volatile memory after each one or more writing operations;
   scanning blocks of the non-volatile memory when the flash memory system is powered on after a power loss;
   recovering a known good record from the non-volatile memory;
   determining whether a last written block is a last known good block in the good record; and
   if the last written block is the last known good block in the good record, joining the last written block to a mapping of logical block addresses versus physical block addresses, otherwise finding the last known good block from the good record and joining the last known good block to the mapping.

2. The method of claim 1, further comprising the steps of:
   storing the record in a volatile memory at first; and
   writing the record stored in the volatile memory to the non-volatile memory at a predetermined checkpoint.

3. The method of claim 1, wherein the record is stored in a spare area or a user data area of the non-volatile memory.

4. The method of claim 1, wherein the record is recorded with a counter.

5. The method of claim 1, wherein the record is recorded with a bit.

6. The method of claim 1, wherein the record is recorded with an array.

7. The method of claim 1, wherein the record is recorded with a flag.

8. The method of claim 1, wherein the non-volatile memory comprises paired pages.

9. The method of claim 8, further comprising the step of recording a status of one of the paired pages when writing to the other of the paired pages.

* * * * *